(12) United States Patent
Seo et al.

(10) Patent No.: US 9,546,774 B2
(45) Date of Patent: Jan. 17, 2017

(54) LUMINOUS FLUX CONTROL MEMBER, LIGHT EMITTING DEVICE, AND DISPLAY DEVICE

(71) Applicant: LG INNOTEK CO., LTD., Seoul (KR)

(72) Inventors: Eun Sung Seo, Seoul (KR); Lee Im Kang, Seoul (KR); Ki Cheol Kim, Seoul (KR); Gi Seok Lee, Seoul (KR); Chang Hyuck Lee, Seoul (KR); Hyun Ho Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 222 days.

(21) Appl. No.: 13/946,743

(22) Filed: Jul. 19, 2013

(65) Prior Publication Data
US 2014/0043826 A1    Feb. 13, 2014

(30) Foreign Application Priority Data

Aug. 8, 2012 (KR) .................. 10-2012-0086889

(51) Int. Cl.
| | | |
|---|---|---|
| *F21V 13/04* | (2006.01) | |
| *G02B 19/00* | (2006.01) | |
| *G02F 1/1335* | (2006.01) | |
| *H01L 33/58* | (2010.01) | |

(52) U.S. Cl.
CPC .......... *F21V 13/04* (2013.01); *G02B 19/0061* (2013.01); *G02B 19/0071* (2013.01); *G02F 1/133603* (2013.01); *G02F 2001/133607* (2013.01); *H01L 33/58* (2013.01)

(58) Field of Classification Search
CPC .. F21V 13/04; G02B 19/0061; G02B 19/0071
USPC ....................................................... 362/97.1
See application file for complete search history.

(56) References Cited

U.S. PATENT DOCUMENTS

| | | | | |
|---|---|---|---|---|
| 7,413,318 | B2 * | 8/2008 | Hsu et al. ..................... 362/97.1 |
| 7,602,559 | B2 * | 10/2009 | Jang et al. ..................... 359/726 |
| 8,118,457 | B2 * | 2/2012 | Kanai ....................... F21V 5/04 |
| | | | | 362/327 |
| 2002/0163808 | A1 * | 11/2002 | West ......................... F21V 5/04 |
| | | | | 362/255 |

FOREIGN PATENT DOCUMENTS

GB                     248713 A   *   4/2012   ............. H01L 33/36

* cited by examiner

*Primary Examiner* — Sharon Payne
(74) *Attorney, Agent, or Firm* — Saliwanchik, Lloyd & Eisenschenk

(57) ABSTRACT

Disclosed are a luminous flux control member, which includes an incident surface onto which a light is incident, a reflective surface reflecting the incident light, and a light exit surface outputting the reflected light according to at least two orientation angles based on one direction perpendicular to a central axis connecting a center of the incident surface with a center of the reflective surface, a light emitting device and a display device having the same. The uniformity in the brightness of the display device is ensured and the display device is realized in small size.

17 Claims, 11 Drawing Sheets

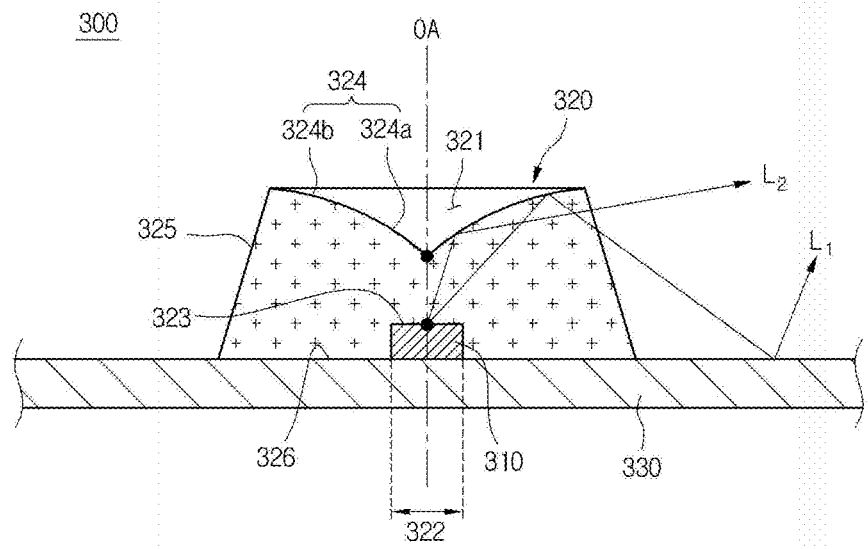
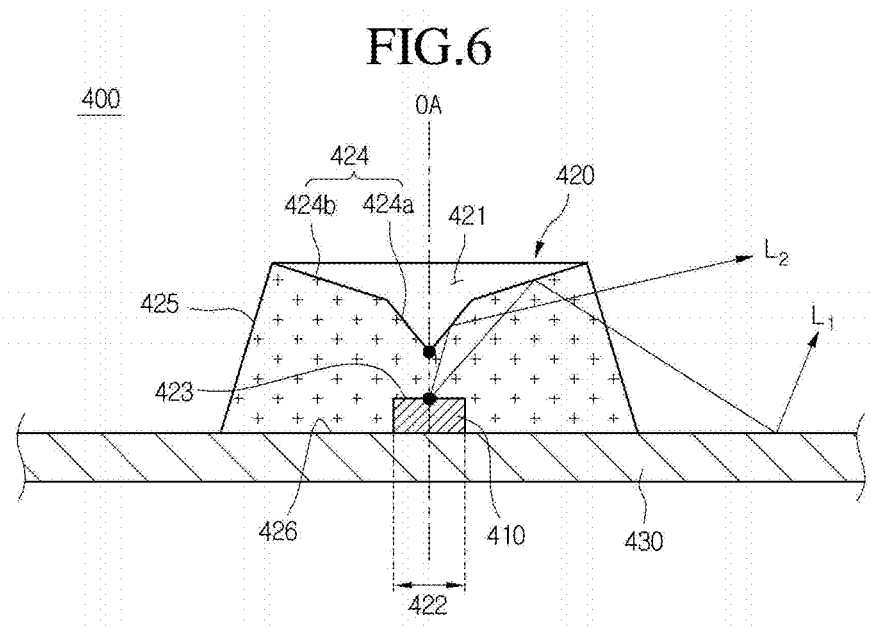

LUMINOUS FLUX CONTROL MEMBER, LIGHT EMITTING DEVICE, AND DISPLAY DEVICE

CROSS-REFERENCE TO RELATED APPLICATION

This application claims the benefit under 35 U.S.C. §119 of Korean Patent Application No. 10-2012-0086889, filed Aug. 8, 2012, which is hereby incorporated by reference in its entirety.

BACKGROUND

The disclosure relates to a luminous flux control member, a light emitting device, and a display device.

In general, since liquid crystal displays (LCDs) can be realized in terms of lightness and slimness, and can reduce power consumption, the LCDs have been extensively used. The LCDs display images by using the characteristic of liquid crystal aligned according to voltages or temperatures. The LCDs include a backlight unit (BLU) and a liquid crystal display panel. The BLU is mounted on the bottom surface of the liquid crystal display panel to output light toward the liquid crystal display panel. The liquid crystal display panel displays images by using light incident thereon from the BLU.

In this case, the BLU includes a light source to generate light actually, and is classified into an edge-type BLU and a direct-type BLU according to positions of the light source. According to the edge-type BLU, the light source is positioned at the lateral portion of the BLU, and the light generated from the light source is guided through a light guide plate so that the light is output toward the liquid crystal display panel. According to the direct-type BLU, the light source is positioned corresponding to the bottom surface of the liquid crystal display panel, and the light generated from the light source is directly output toward the liquid crystal display panel.

However, the BLU has a problem in that the BLU irregularly irradiates light toward the liquid crystal display panel. Accordingly, the performance of the LCD may be deteriorated. Therefore, in order to solve the problem, the distance between the direct-type BLU and the liquid crystal display panel must be ensured. In this case, as the distance between the BLU and the liquid crystal display panel is increased, the performance of the LCD can be more improved.

However, the LCD is realized at a thick thickness corresponding to the distance between the BLU and the liquid crystal display panel. In other words, the realization of a smaller-size LCD may be difficult. Accordingly, a scheme of ensuring the uniformity in brightness of the LCD and realizing the smaller-size LCD is required.

BRIEF SUMMARY

The disclosure is to provide a luminous flux control member, a light emitting device, and a display device, capable of ensuring the uniformity in brightness of the display device and realizing the display device in small size.

According to the disclosure, there is provided a luminous flux control member including an incident surface onto which a light is incident, a reflective surface reflecting the incident light, and a light exit surface outputting the reflected light according to at least two orientation angles based on one direction perpendicular to a central axis connecting a center of the incident surface with a center of the reflective surface.

According to the disclosure, there is provided a light emitting device including a driving substrate, a light source connected to the driving substrate, and a luminous flux control member onto which a light generated from the light source is incident.

In this case, the luminous flux control member includes an incident surface onto which the generated light is incident, a reflective surface reflecting the incident light, and a light exit surface outputting the reflected light according to at least two orientation angles based on one direction perpendicular to a central axis connecting a center of the incident surface with a center of the reflective surface.

According to the disclosure, there is provided a display device including a driving substrate, a light source connected to the driving substrate, a luminous flux control member onto which a light generated from the light source is incident, and a display panel onto which a light output from the luminous flux control member is incident.

In this case, the luminous flux control member includes an incident surface onto which the generated light is incident, a reflective surface reflecting the incident light, and a light exit surface outputting the reflected light according to at least two orientation angles based on one direction perpendicular to a central axis connecting a center of the incident surface with a center of the reflective surface.

As described above, in the luminous flux control member, the light emitting device, and the display device according to the present embodiment, the luminous flux control member outputs light according to at least two orientation angles, so that light generated from the light source can be diffused in a wider range. Accordingly, the light emitting device can effectively irradiate light toward the display panel. Therefore, even if the number of the light sources is not increased in the backlight unit, the performance of the display device can be ensured. In addition, the distance between the backlight unit and the display panel can be reduced. In other words, the thickness of the display device can be reduced. Therefore, the uniformity in the brightness of the display device can be ensured, and the display device can be realized in small size.

BRIEF DESCRIPTION OF THE DRAWINGS

FIG. 5 is a sectional view showing a light emitting device according to the third embodiment.

FIG. 6 is a sectional view showing a light emitting device according to the fourth embodiment.

DETAILED DESCRIPTION

Figure 1:
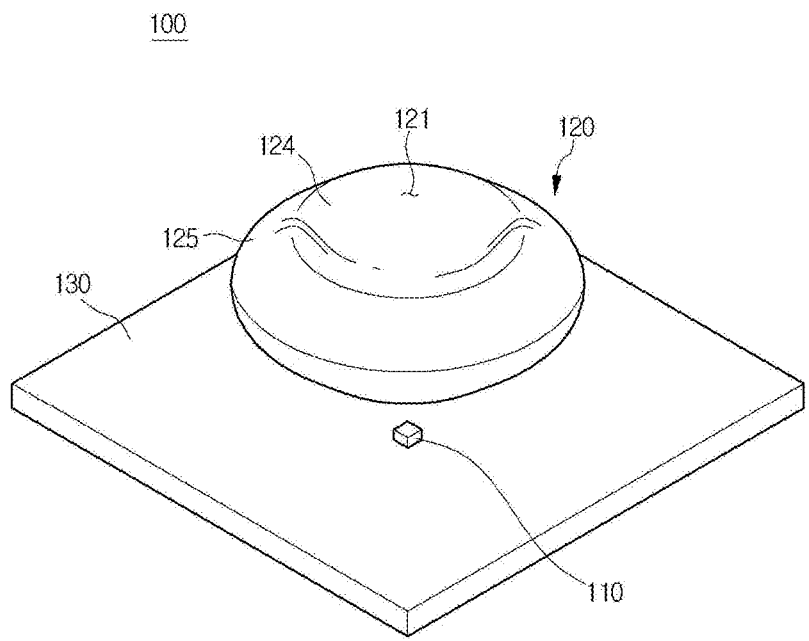
FIG. 1 is an exploded perspective view showing a light emitting device according to the first embodiment.

Hereinafter, the embodiments will be described in more detail with reference to accompanying drawings. In the following description, for the illustrative purpose, the same components will be assigned with the same reference numerals. If it is determined that description about well known functions or configurations may make the subject matter of the embodiments unclear, the details thereof will be omitted.

In the following description of the embodiments, it will be understood that when a panel, sheet, member, guide, or unit is referred to as being "on" or "under" another panel, sheet, member, guide, or unit, it can be "directly" or "indirectly" on the other panel, sheet, member, guide, or unit, or one or more intervening layers may also be present. Such a position of each component has been described with reference to the drawings. The size of each component shown in the drawings may be exaggerated, omitted or schematically drawn for the purpose of convenience or clarity. In addition, the size of the component does not utterly reflect an actual size.

Figure 2:
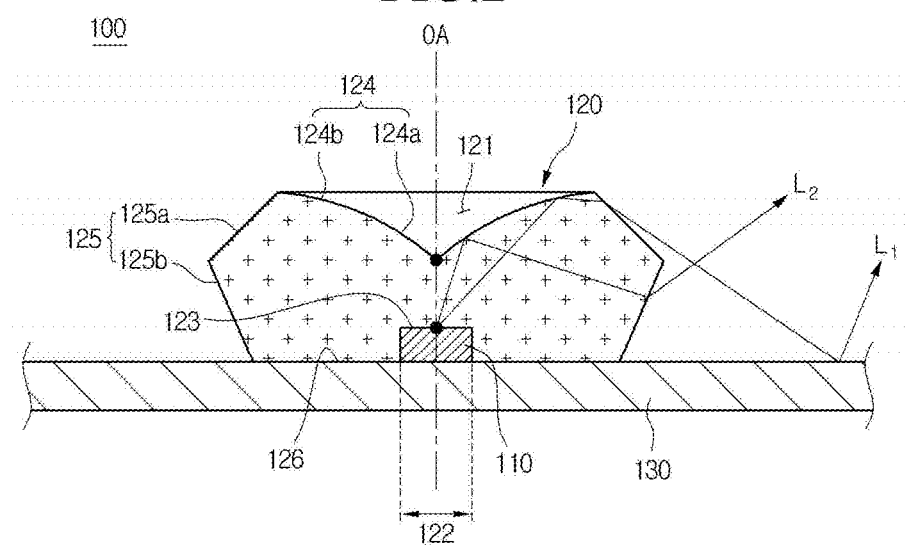
FIG. 2 is a sectional view showing one section of FIG. 1.
Figure 3:
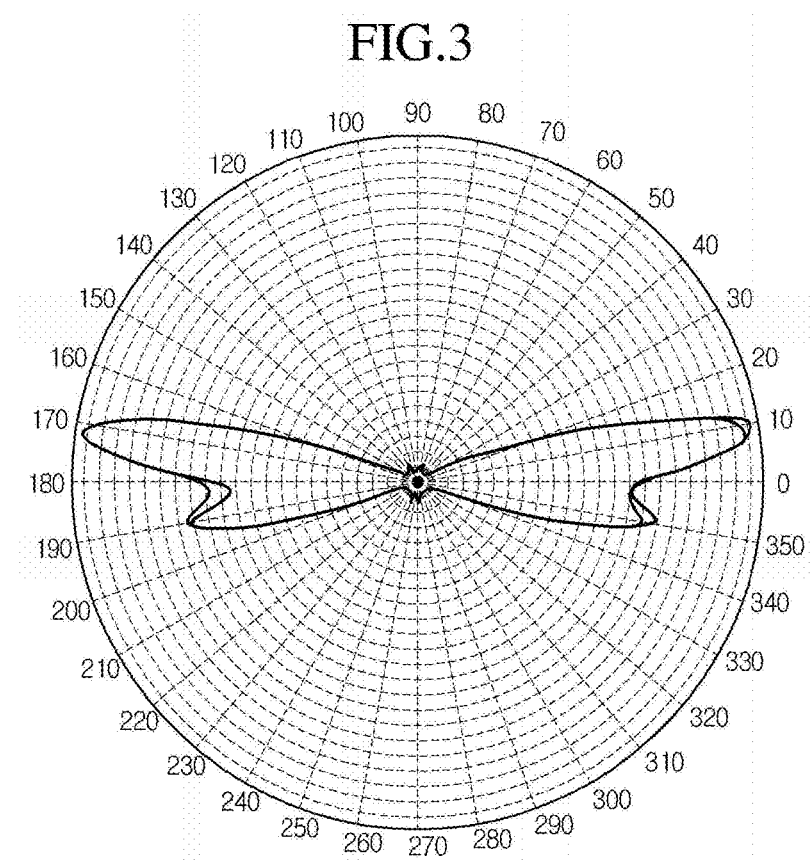
FIG. 3 is a view showing orientation angles of a luminous flux control member in the light emitting device according to the first embodiment.

FIG. 1 is an exploded perspective view showing a light emitting device according to the first embodiment. In addition, FIG. 2 is a sectional view showing one section of FIG. 1. In addition, FIG. 3 is a view showing orientation angles of a luminous flux control member in the light emitting device according to the first embodiment.

Referring to FIGS. 1 and 2, a light emitting device 100 according to the present embodiment includes a light source 110, a luminous flux control member 120, and a driving substrate 130.

The light source 110 generates light. The light source 110 is mounted on the driving substrate 130. The light source 110 generates the light according to a driving signal received in the driving substrate 130. In this case, the light source 110 may adjust the quantity of the light according to the intensity of current or voltage applied to the driving substrate 130.

In this case, the light source 110 may serve as a dot light source such as a light emitting diode (LED). Further, the light source 110 may serve as a surface light source formed by arranging a plurality of LEDs. In other words, the light source 110 may be formed by distributing the LEDs at a predetermined distance. In this case, each LED represents an LED package including an LED chip. In addition, the LEDs may output white light, and may separately output blue, green, and red lights.

The luminous flux control member 120 controls the luminous flux of the light emitted from the light source 110. In other words, the luminous flux control member 120 diffuses the light generated from the light source 110. The luminous flux control member 120 is mounted on the driving substrate 130. In addition, the luminous flux control member 120 covers the light source 110. In this case, the luminous flux control member 120 may receive a portion or the entire portion of the light source 110. The luminous flux control member 120 may separately cover the LEDs of the light source 110. In this case, the luminous flux control member 120 has an isotropic structure. In this case, the luminous flux control member 120 may have a diameter of 22 mm. In addition, an optical axis OA of the light source 110 may pass through the center of the luminous flux control member 120.

In this case, the luminous flux control member 120 may include a transparent material. The luminous flux control member 120 may have the refractive index of about 1.4 to about 15. Further, the luminous flux control member 120 may include transparent resin. In addition, the luminous flux control member 120 may include thermo-plastic resin. Besides, the luminous flux control member 120 may include silicon-based resin. For example, the luminous flux control member 120 may include PMMA (poly methyl methacrylate).

The luminous flux control member 120 is formed therein a recess part 121 and a groove part 122. In addition, the luminous flux control member 120 includes an incident surface 123, a reflective surface 124, a light exit surface 125, and a rear surface 126.

The recess part 121 is formed in an upper portion of the luminous flux control member 120. In addition, the recess part 121 corresponds to the light source 110. In this case, the recess part 121 is concaved down toward the light source 110. In addition, the recess part 121 is provided at the central portion of the luminous flux control member 120. In this case, the center of the recess part 121 is provided on the optical axis OA of the light source 110. In other words, the recess part 121 has a line symmetric structure about the optical axis OA of the light source 110.

The groove part 122 is formed in a lower portion of the luminous flux control member 120. In addition, the groove part 122 corresponds to the light source 110. In this case, the groove part 122 is provided in opposition of the recess part 121. In addition, the groove part 122 is concaved down toward the recess part 121. In other words, the groove part 122 is formed at the central portion of the luminous flux control member 120. In this case, the center of the groove part 122 is provided on the optical axis OA of the light source 110. In other words, the groove part 122 has a line symmetric structure about the optical axis OA of the light source 110. The groove part 122 receives a portion or the entire portion of the light source 110. In other words, the light source 110 is provided in the recess part 121.

The incident surface 123 is a surface onto which the light generated from the light source 110 is incident. The incident surface 123 is provided in opposition to the light source 110. In this case, the center of the incident surface 123 is provided on the optical axis OA of the light source 110. In addition, the incident surface 123 is provided at the groove part 122. In this case, the incident surface 123 is an inner surface of the groove part 122. The incident surface 123 may closely make contact with the light source 110. In other words, the incident surface 123 may directly make contact with the light source 110. Accordingly, the light generated from the light source 110 may be incident onto the incident surface 123 without light loss between the light source 110 and the incident surface 123.

The reflective surface 124 is a surface to reflect the light which is incident through the incident surface 123. In this case, the reflective surface 124 may totally reflect the light.

In this case, the reflective surface 124 may reflect the light in a lateral direction, in a lateral-upward direction, or in a lateral-downward direction. In other words, the reflective surface 124 may reflect the light to the light exit surface 125. Accordingly, the reflective surface 124 may inhibit a hot spot phenomenon in which light is excessively concentrated on the central portion of the luminous flux control member 120.

The reflective surface 124 may reflect light according to at least two reflection angels. In this case, the reflective surface 124 may reflect light in the lateral-upward direction or the lateral-downward direction. In other words, the reflective surface 124 may reflect the light in the lateral-upward direction based on one of the reflection angles. One of the reflection angles may be greater than or equal to 0°, and less than 180°. In addition, the reflective surface 124 may reflect the light in the lateral-downward direction based on another of the reflection angles. In this case, another of reflection angles may be greater than or equal to 180° and less than 360°.

The reflective surface 124 is provided in opposition to the incident surface 123. The center of the reflective surface 124 is provided on the optical axis OA of the light source 110. In addition, the reflective surface 124 is provided at the recess part 121. In this case, the reflective surface 124 is an inner surface of the recess part 121. In other words, the reflective surface 124 is extended from the optical axis OA of the light source 110 to the light exit surface 125. In this case, the reflective surface 124 is extended in an outer direction perpendicular to or inclined to the optical axis OA of the light source 110. In this case, the distance between the reflective surface 124 and the optical axis OA of the light source 110 may be gradually increased as the reflective surface 124 is distant from the light source 110. In addition, the reflective surface 124 may surround the optical axis OA of the light source 110. In addition, the reflective surface 124 is a spherical surface.

The reflective surface 124 includes a first reflective surface 124*a* and a second reflective surface 124*b*. In this case, the first reflective surface 124*a* is connected to the second reflective surface 124*b* to form a single spherical surface.

The first reflective surface 124*a* reflects light according to a first reflection angle. In this case, the first reflective surface 124*a* may reflect the light in the lateral-upward direction or the lateral-downward direction. In this case, the first reflection angle may be greater than or equal to 0° and may be less than 180°. In addition, the first reflection angle may be greater than or equal to 180° and may be less than 360°

In addition, the first reflective surface 124*a* is extended from the optical axis OA. In this case, the first reflective surface 124*a* is inclined at a first slope from the optical axis OA. In this case, the first reflective surface 124*a* may have the shape of a cone having a vertex directed to the light source 110.

The second reflective surface 124*b* reflects light according to a second reflection angle. In this case, the second reflective surface 124*b* may reflect the light in the lateral-upward direction or the lateral-downward direction. In this case, the second reflection angle may be greater than or equal to 0° and may be less than 180°. In addition, the second reflection angle may be greater than or equal to 180° and may be less than 360°

In addition, the second reflective surface 124*b* is extended from the light exit surface 125. In this case, the second reflective surface 124*b* is bent or curved while being extended from the light exit surface 125. In addition, the second reflective surface 124*b* is extended from the light exit surface 125 to the first reflective surface 124*a*. In this case, the second reflective surface 124*b* is curved from the first reflective surface 124*a*. In addition, the second reflective surface 124*b* is inclined at a second slope from the optical axis OA. In this case, the second slope may be smaller than the first slope.

The light exit surface 125 is a surface to output light incident onto the incident surface 123 or light reflected from the reflective surface 124. In this case, the light exit surface 125 may refract the light. In this case, the light exit surface 125 may refract the light in the lateral direction, lateral-upward direction, or lateral-downward direction.

In this case, as shown in FIG. 3, the light exit surface 125 outputs light according to at least two orientation angles. In this case, the light exit surface 125 may output the light in the lateral-upward direction and lateral-downward direction. In other words, the light exit surface 125 may output the light according to one of the orientation angles in the lateral-upward direction. One of the orientation angles may be greater than or equal to 0°, and less than 180°. Preferably, one of the orientation angles may be greater than or equal to 157°. In addition, the light exit surface 125 may output the light according to another of the orientation angles in the lateral-downward direction. In this case, another of orientation angles may be greater than or equal to 180° and less than 360°. Preferably, another of the orientation angles may be greater than or equal to 190°

In this case, the orientation angles may be determined on at least one of the reflective surface 124 and the light exit surface 125. For example, the orientation angles may be determined depending on the slope of the light exit surface 125 from the optical axis OA of the light source 110. In addition, the orientation angles may be determined depending on the slope of the reflective surface 124 from the optical axis OA of the light source 110. In other words, the orientation angles may correspond to the reflection angles of the reflective surface 124.

In addition, the light exit surface 125 is extended from the reflective surface 124. Further, the light exit surface 125 is bent or curved while being extended from the reflective surface 124. In this case, the light exit surface 125 may be extended to the extent of being close to the driving substrate 130. The light exit surface 125 surrounds the optical axis OA of the light source 110. In this case, the light exit surface 125 may surround the reflective surface 124.

The light exit surface 125 includes first and second light exit surfaces 125*a* and 125*b*.

The first light exit surface 125*a* outputs light according to a first orientation angle. In this case, the first light exit surface 125*a* may output light in the lateral-upward direction, or the lateral-downward direction. In this case, the first orientation angle may be greater than or equal to 0°, and less than 180°. Preferably, the first orientation angle may be 157° or more. In addition, the first orientation angle may be greater than or equal to 180°, and less than 360°. Preferably, the first orientation angle may be greater than or equal to 190°. In addition, the first light exit surface 125*a* may refract light.

In addition, the first light exit surface 125*a* is extended from the reflective surface 124. In this case, the first light exit surface 125*a* is bent or curved while being extended from the reflective surface 124. In this case, the first light exit surface 125*a* is extended in the lateral-downward direction from the reflective surface 124. In other words, the first light exit surface 125*a* is extended in a direction inclined at a third slope from the optical axis OA. Preferably, the third slope may be −26°. In this case, the distance between the first light exit surface 125a and the optical axis OA of the light source 110 may be gradually increased as the first light exit surface 125a is distant from the reflective surface 124. In addition, the first light exit surface 125a may be a spherical surface or an aspherical surface.

The second light exit surface 125b outputs light according to a second orientation angle. In this case, the second light exit surface 125b may output light in the lateral-upward direction, or the lateral-downward direction. In this case, the second orientation angle may be greater than or equal to 0°, and less than 180°. Preferably, the second orientation angle may be 157° or more. In addition, the second orientation angle may be greater than or equal to 180°, and less than 360°. Preferably, the second orientation angle may be greater than or equal to 190°. In addition, the second light exit surface 125b may refract light.

In addition, the second light exit surface 125b is extended from the incident surface 123. In this case, the second light exit surface 125b is extended from the incident surface 123 to the first light exit surface 125a. In this case, the second light exit surface 125b is bent from the first light exit surface 125b. In addition, the second light exit surface 125b is extended in the lateral-upward direction from the incident surface 123. In other words, the second light exit surface 125b is extended in a direction inclined at a fourth slope from the optical axis OA. Preferably, the fourth slope may be 18°. In this case, the distance between the second light exit surface 125b and the optical axis OA of the light source 110 may be gradually decreased as the second light exit surface 125b is distant from the incident surface 123. Besides, the second light exit surface 125b may be a spherical surface or an aspherical surface.

The rear surface 126 is interposed between the incident surface 123 and the second light exit surface 125b. In other words, the rear surface 126 is extended from the incident surface 123 to the second light exit surface 125b. In this case, the rear surface 126 is extended in an outer direction perpendicular to the optical axis of the light source 110. In addition, the rear surface 126 connects the incident surface 123 to the light exit surface 125. In addition, the rear surface 126 is provided in opposition to the driving substrate 130. In this case, the rear surface 126 may closely make contact with the driving substrate 130. In other words, the rear surface 126 may directly make contact with the driving substrate 130.

The driving substrate 130 supports the light source 110 and controls the driving of the light source 110. In other words, the driving substrate 130 is electrically connected to the light source 110. The driving substrate 130 transmits a driving signal to the light source 110. In this case, the driving substrate 130 may be a printed circuit board (PCB). For example, the driving substrate 130 may have a flat plate structure. In addition, the driving substrate 130 may be provided therein with a plurality of transmission lines (not shown). In this case, one end of each transmission line may be connected to a driving unit (not shown). The driving unit may be a power unit to supply power to the transmission line. Besides, an opposite end of the transmission line is exposed to the outside to serve as a connector (not shown). In this case, as the light source 110 is bonded to the connector through a paste, the driving substrate 130 may be electrically connected to the light source 110.

In addition, the driving substrate 130 reflects light output from the luminous flux control member 120. In this case, the driving substrate 130 reflects light output in the lateral-downward direction from the luminous flux control member 120. In this case, the driving substrate 130 may reflect light output according to one of the orientation angles. In addition, the driving substrate 130 may totally reflect the light. In this case, the driving substrate 130 may reflect the light in the lateral-upward direction. To this end, the driving substrate 130 may be formed by coating a reflective material on the printed circuit board. In addition, the driving substrate 130 may be formed by mounting a reflective structure on the printed circuit board.

According to the present embodiment, the light source 110 generates light. Thereafter, the luminous flux control member 120 outputs light according to at least two orientation angles as shown in FIG. 3. In this case, the luminous flux control member 120 outputs the light in the lateral-upward direction and lateral-downward direction. In other words, the luminous flux control member 120 may output light according to one of the orientation angles in the lateral-upward direction. In this case, one of the orientation angles is greater than or equal to 0°, and less than 180°. Preferably, one of the orientation angles may be greater than or equal to 157°. In addition, the luminous flux control member 120 may output light according to another of the orientation angles in the lateral-downward direction. In this case, another of the orientation angles may be greater than or equal to 180° and less than 360°. Preferably, another of the orientation angles may be greater than or equal to 190°. Thereafter, the driving substrate 130 reflects light.

For instance, after a first light L1 is generated from the light source 110, the first light L1 is output from the first light exit surface 125a. In this case, the first light L1 is reflected from the second reflective surface 124b, and refracted on the first light exit surface 125a. In this case, the first light L1 is output according to the first orientation angle from the first light exit surface 125a. In this case, the first orientation angle may be greater than or equal to 180°, and less than 360°. In addition, the first light L1 is reflected from the driving substrate 130.

For instance, after a second light L2 is generated from the light source 110, the second light L2 is output from the second light exit surface 125b. In this case, the second light L2 may be reflected from the first reflective surface 124a, and refracted on the second light exit surface 125b. In this case, the second light L2 is output according to the second orientation angle from the second light exit surface 125b. In this case, the second orientation angle may be greater than or equal to 0°, and less than 180°.

Figure 4:
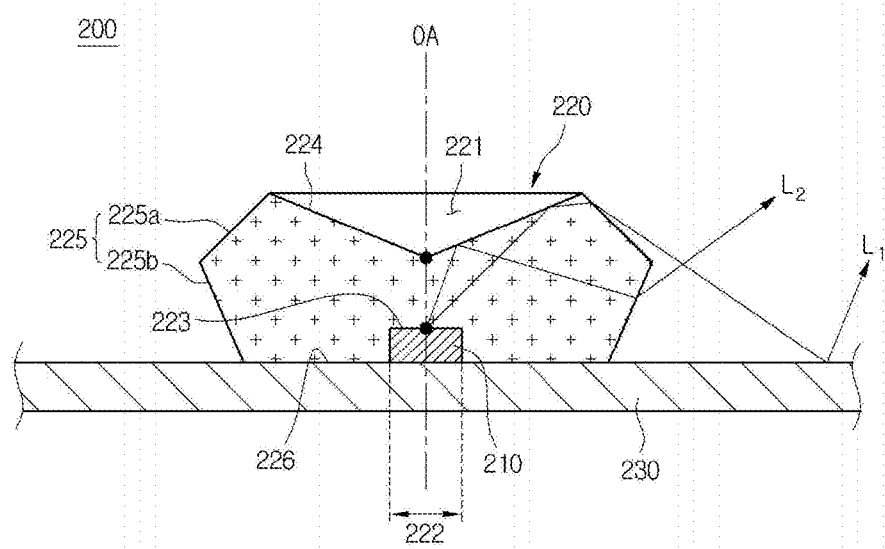
FIG. 4 is a sectional view showing a light emitting device according to the second embodiment.

FIG. 4 is a sectional view showing a light emitting device according to a second embodiment.

Referring to FIG. 4, a light emitting device 200 according to the present embodiment includes a light source 210, a luminous flux control member 220, and a driving substrate 230. The luminous flux control member 220 is formed therein a recess part 221 and a groove part 222. In addition, the luminous flux control member 220 includes an incident surface 223, a reflective surface 224, a light exit surface 225, and a rear surface 226. In this case, the light exit surface 225 includes first and second light exit surfaces 225a and 225b. Hereinafter, since the above components of the light emitting device 200 according to the present embodiment are similar to the corresponding components of the previous embodiment described above, the details thereof will be omitted in order to avoid redundancy.

According to the luminous flux control member 220 of the present embodiment, the reflective surface 224 is an aspheric surface. In this case, the reflective surface 224 is inclined at a predetermined slope from the optical axis OA of the light source 210. In addition, the reflective surface 224 reflects light generated from the light source 210. In this case, the reflective surface 224 may reflect light in the lateral direction, the lateral-upward direction, or the lateral-downward direction. In other words, the reflective surface 224 may reflect the light to the light exit surface 225. In this case, the reflective surface 224 may reflect the light through the first and second light exit surfaces 225a and 225b.

In this case, the light exit surface 225 outputs light according to at least two orientation angles. The orientation angles may be determined on the light exit surface 225. For example, the orientation angles may be determined depending on the slope of the light exit surface 225 from the optical axis OA of the light source 210.

For instance, after the first light L1 is generated from the light source 210, the first light L1 is output from the first light exit surface 225a. In this case, the first light L1 is reflected from the reflective surface 224, and refracted on the first light exit surface 225a. In this case, the first light L1 is output according to the first orientation angle from the first light exit surface 225a. In this case, the first orientation angle may be greater than or equal to 180°, and less than 360°. In addition, the first light L1 is reflected from the driving substrate 230.

For instance, after the second light L2 is generated from the light source 210, the second light L2 is output from the second light exit surface 225b. In this case, the second light L2 may be reflected from the reflective surface 224, and refracted on the second light exit surface 225b. In this case, the second light L2 is output according to the second orientation angle from the second light exit surface 225b. In this case, the second orientation angle may be greater than or equal to 0°, and less than 180°.

FIG. 5 is a sectional view showing a light emitting device according to a third embodiment.

Referring to FIG. 5, a light emitting device 300 according to the present embodiment includes a light source 310, a luminous flux control member 320, and a driving substrate 330. The luminous flux control member 320 is formed therein a recess part 321 and a groove part 322. In addition, the luminous flux control member 320 includes an incident surface 323, a reflective surface 324, a light exit surface 325, and a rear surface 326. The reflective surface 324 includes first and second reflective surface 324a and 324b. Hereinafter, since the above components of the light emitting device 300 according to the present embodiment are similar to the corresponding components of the previous embodiment described above, the details thereof will be omitted in order to avoid redundancy.

According to the luminous flux control member 320 of the present embodiment, the light exit surface 325 is an aspheric surface. In this case, the light exit surface 325 is inclined at a predetermined slope from the optical axis OA of the light source 310. In addition, the light exit surface 325 outputs light reflected from the reflective surface 324. In this case, the light exit surface 325 outputs the light according to at least two orientation angles. The light exit surface 325 may maintain the traveling path of the light. In addition, the light exit surface 325 may refract the light. In addition, the light exit surface 325 may output the light in the lateral direction, the lateral-upward direction, or the lateral-backward direction. In other words, the light exit surface 325 may output the light according to one of the orientation angles in the lateral-upward direction. In addition, the light exit surface 325 may exit light according to another of the orientation angles in the lateral-downward direction.

In this case, the orientation angles may be determined on the reflective surface 324. In other words, the orientation angles may correspond to reflection angles of the reflective surface 324.

For instance, after the first light L1 is generated from the light source 310, the first light L1 is reflected from the second reflective surface 324b and output from the light exit surface 325. In this case, the first light L1 may be refracted on the light exit surface 325. In this case, the first light L1 is output according to the first orientation angle from the light exit surface 325. In this case, the first orientation angle may be greater than or equal to 180°, and less than 360°. In addition, the first light L1 is reflected from the driving substrate 330.

Meanwhile, after the second light L2 is generated from the light source 310, the first light L1 is reflected from the first reflective surface 324a and output from the light exit surface 325. In this case, the second light L2 may be refracted on the light exit surface 325. In this case, the second light L2 is output according to the second orientation angle from the light exit surface 325. In this case, the second orientation angle may be greater than or equal to 0°, and less than 180°.

FIG. 6 is a sectional view showing a light emitting device according to a fourth embodiment.

Referring to FIG. 6, a light emitting device 400 according to the present embodiment includes a light source 410, a luminous flux control member 420, and a driving substrate 430. The luminous flux control member 420 is formed therein a recess part 421 and a groove part 422. In addition, the luminous flux control member 420 includes an incident surface 423, a reflective surface 424, a light exit surface 425, and a rear surface 426. The reflective surface 424 includes first and second reflective surface 424a and 424b. Hereinafter, since the above components of the light emitting device 400 according to the present embodiment are similar to the corresponding components of the previous embodiment described above, the details thereof will be omitted in order to avoid redundancy.

According to the luminous flux control member 420 of the present embodiment, the reflective surface 424 is an aspheric surface. In the reflective surface 424, the second reflective surface 424b is bent from the first reflective surface 424a.

In other words, the first reflective surface 424a is extended from the optical axis OA. In this case, the first reflective surface 424a is extended in a direction inclined at the first slope from the optical axis OA. In this case, the first reflective surface 424a may have the shape of a cone having a vertex directed toward the light source 410.

In addition, the second reflective surface 424b is extended from the light exit surface 425. In this case, the second reflective surface 424b is bent or curved while being extended from the light exit surface 425. In addition, the second reflective surface 424b is extended from the light exit surface 425 to the first reflective surface 424a. In this case, the second reflective surface 424b is extended in a direction inclined at the second slope from the optical axis OA. In this case, the second slope may be smaller than the first slope.

In this case, the light exit surface 425 outputs light according to at least two orientation angles. The orientation angles may be determined on the reflective surface 424. In other words, the orientation angles may correspond to reflection angles of the reflective surface 424.

For instance, after the first light L1 is generated from the light source 410, the first light L1 is reflected from the second reflective surface 424b and output from the light exit surface 425. In this case, the first light L1 may be refracted on the light exit surface 425. In this case, the first light L1 is output according to the first orientation angle from the light exit surface 425. In this case, the first orientation angle may be greater than or equal to 180°, and less than 360°. In addition, the first light L1 is reflected from the driving substrate 430.

Meanwhile, after the second light L2 is generated from the light source 410, the first light L1 is reflected from the first reflective surface 424*a* and output from the light exit surface 425. In this case, the second light L2 may be refracted on the light exit surface 425. In this case, the second light L2 is output according to the second orientation angle from the light exit surface 425. In this case, the second orientation angle may be greater than or equal to 0°, and less than 180°.

Figure 7:
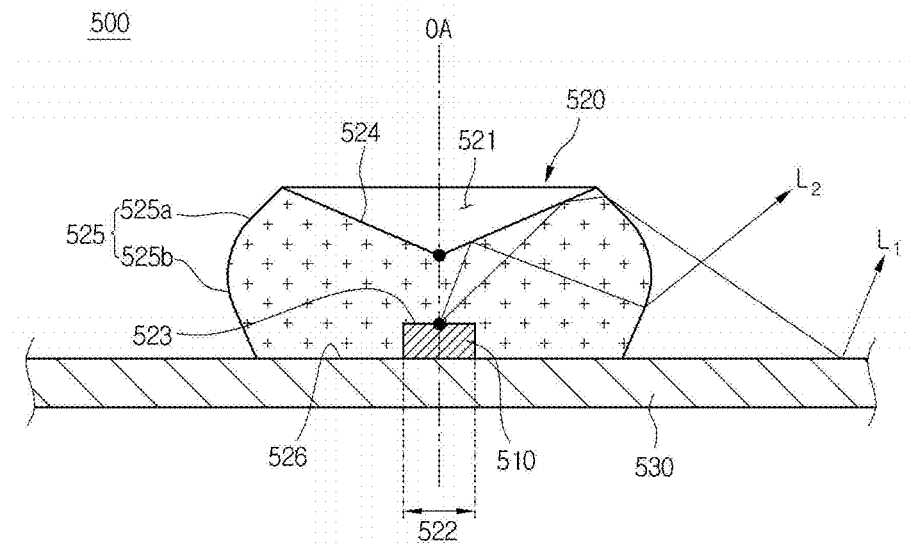
FIG. 7 is a sectional view showing a light emitting device according to the fifth embodiment.

FIG. 7 is a sectional view showing a light emitting device according to a fifth embodiment.

Referring to FIG. 7, a light emitting device 500 according to the present embodiment includes a light source 510, a luminous flux control member 520, and a driving substrate 530. The luminous flux control member 520 is formed therein a recess part 521 and a groove part 522. In addition, the luminous flux control member 520 includes an incident surface 523, a reflective surface 524, a light exit surface 525, and a rear surface 526. The light exit surface 525 includes first and second light exit surfaces 525*a* and 525*b*. Hereinafter, since the above components of the light emitting device 500 according to the present embodiment are similar to the corresponding components of the previous embodiment described above, the details thereof will be omitted in order to avoid redundancy.

According to the luminous flux control member 520 of the present embodiment, the light exit surface 525 is a spherical surface. In this case, the first light exit surface 525*a* is connected to the second light exit surface 525*b* to form a single spherical surface. In this case, the second light exit surface 525*b* is curved from the first light exit surface 525*a*.

In other words, the first light exit surface 525*a* is extended from the reflective surface 524. In addition, the first light exit surface 525*a* is extended in the direction inclined at the third slope from the optical axis OA. In this case, the distance between the first light exit surface 525*a* and the optical axis OA of the light source 510 is gradually increased as the first light exit surface 525*a* is distant from the reflective surface 524. In addition, the first light exit surface 525*a* may be a spherical surface or an aspherical surface.

In addition, the second light exit surface 525*b* is extended from the incident surface 523. In this case, the second light exit surface 525*b* is extended from the incident surface 523 to the first light exit surface 525*a*. The second light exit surface 525*b* is curved from the first light exit surface 525*a*. In other words, the second light exit surface 525*b* is extended in a direction inclined at a fourth slope from the optical axis OA. In this case, the distance between the second light exit surface 525*b* and the optical axis OA of the light source 510 may be gradually decreased as the second light exit surface 525*b* is distant from the light incident surface 523. In addition, the second light exit surface 525*b* may be a spherical surface or an aspherical surface.

In addition, the light exit surface 525 outputs light according to at least two orientation angles. In this case, the orientation angles may be determined on the light exit surface 525. In other words, the orientation angles may be determined depending on the slope of the light exit surface 525 from the optical axis OA of the light source 510.

For instance, after the first light L1 is generated from the light source 510, the first light L1 is output from the first light exit surface 525*a*. In this case, the first light L1 is reflected from the reflective surface 524, and refracted on the first light exit surface 525*a*. In this case, the first light L1 is output according to the first orientation angle from the first light exit surface 525*a*. In this case, the first orientation angle may be greater than or equal to 180°, and less than 360°. In addition, the first light L1 is reflected from the driving substrate 530.

Meanwhile, after the second light L2 is generated from the light source 510, the second light L2 is output from the second light exit surface 525*b*. In this case, the second light L2 may be reflected from the reflective surface 524, and refracted on the second light exit surface 525*b*. In this case, the second light L2 is output according to the second orientation angle from the second light exit surface 525*b*. In this case, the second orientation angle may be greater than or equal to 0°, and less than 180°.

Figure 8:
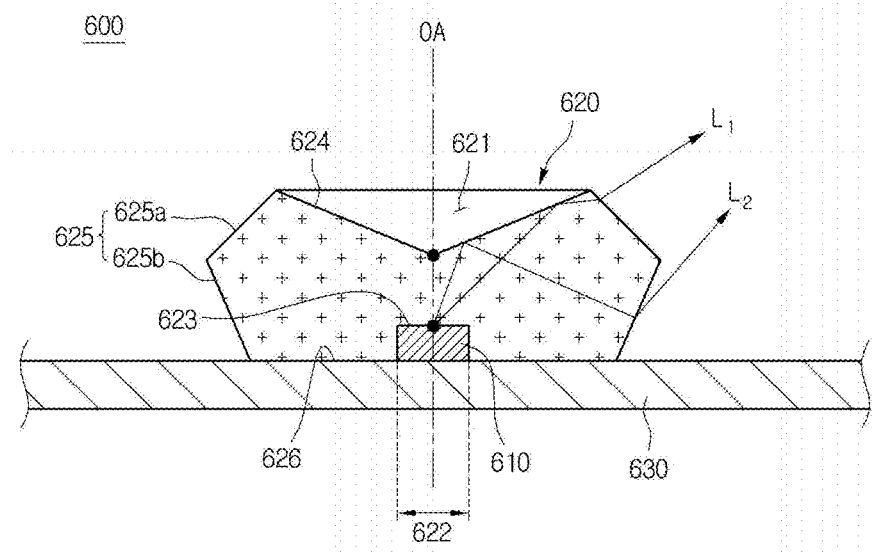
FIG. 8 is a sectional view showing a light emitting device according to the sixth embodiment.

FIG. 8 is a sectional view showing a light emitting device according to a sixth embodiment.

Referring to FIG. 8, a light emitting device 600 according to the present embodiment includes a light source 610, a luminous flux control member 620, and a driving substrate 630. The luminous flux control member 620 is formed therein a recess part 621 and a groove part 622. In addition, the luminous flux control member 620 includes an incident surface 623, a reflective surface 624, a light exit surface 625, and a rear surface 626. The light exit surface 625 may include first and second light exit surfaces 625*a* and 625*b*. Hereinafter, since the above components of the light emitting device 600 according to the present embodiment are similar to the corresponding components of the previous embodiment described above, the details thereof will be omitted in order to avoid redundancy.

According to the luminous flux control member 620 of the present embodiment, the light exit surface 625 outputs light in the lateral-upward direction. In other words, the light exit surface 625 outputs the light according to at least two orientation angles. In this case, the orientation angles are different from each other. In addition, the orientation angles may be greater than or equal to 0°, and less than 180°

In this case, the orientation angles may be determined on at least one of the reflective surface 624 and the light exit surface 625. For example, the orientation angles may be determined depending on the slope of the light exit surface 625 from the optical axis OA of the light source 610. In addition, the orientation angles may be determined depending on the slope of the reflective surface 624 from the optical axis OA of the light source 610. In other words, the orientation angles may correspond to the reflection angles of the reflective surface 624.

For instance, after the first light L1 is generated from the light source 610, the first light L1 is output from the first light exit surface 625*a*. In this case, the first light L1 is reflected from the reflective surface 624, and refracted on the first light exit surface 625*a*. In this case, the first light L1 is output according to the first orientation angle from the first light exit surface 625*a*. In this case, the first orientation angle may be greater than or equal to 0°, and less than 180°.

Meanwhile, after the second light L2 is generated from the light source 610, the second light L2 is output from the second light exit surface 625*b*. In this case, the second light L2 may be reflected from the reflective surface 624, and refracted on the second light exit surface 625*b*. In this case, the second light L2 is output according to the second orientation angle from the second light exit surface 625*b*. In this case, the second orientation angle may be greater than or equal to 0°, and less than 180°.

Figure 9:
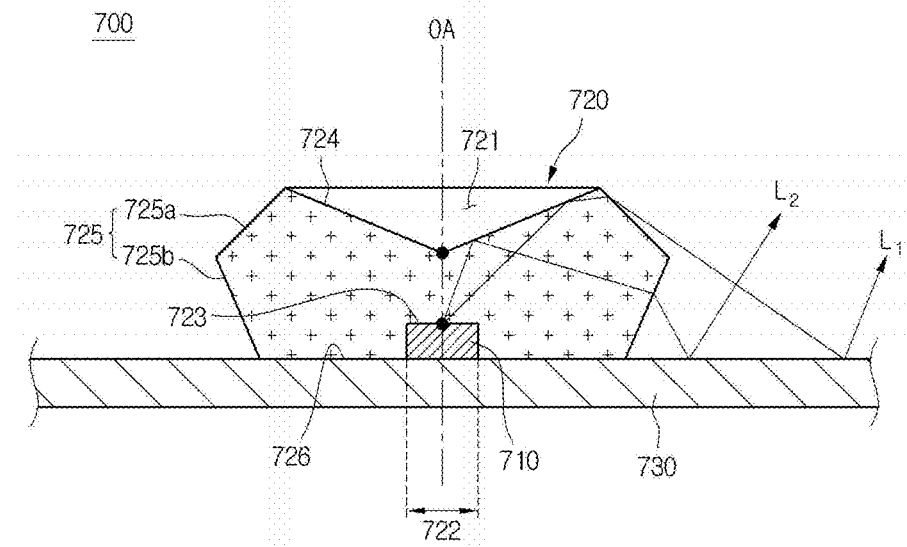
FIG. 9 is a sectional view showing a light emitting device according to the seventh embodiment.

FIG. 9 is a sectional view showing a light emitting device according to a seventh embodiment.

Referring to FIG. 9, a light emitting device 700 according to the present embodiment includes a light source 710, a luminous flux control member 720, and a driving substrate 730. The luminous flux control member 720 is formed therein a recess part 721 and a groove part 722. In addition, the luminous flux control member 720 includes an incident surface 723, a reflective surface 724, a light exit surface 725, and a rear surface 726. The light exit surface 725 may include first and second light exit surfaces 725a and 725b. Hereinafter, since the above components of the light emitting device 700 according to the present embodiment are similar to the corresponding components of the previous embodiment described above, the details thereof will be omitted in order to avoid redundancy.

According to the luminous flux control member 720 of the present embodiment, the light exit surface 725 outputs light in the lateral-downward direction. In other words, the light exit surface 725 outputs the light according to at least two orientation angles. In this case, the orientation angles are different from each other. In addition, all of the orientation angles may be greater than or equal to 180°, and less than 360°

In this case, the orientation angles may be determined on at least one of the reflective surface 724 and the light exit surface 725. For example, the orientation angles may be determined depending on the slope of the light exit surface 725 from the optical axis OA of the light source 710. In addition, the orientation angles may be determined depending on the slope of the reflective surface 724 from the optical axis OA of the light source 710. In other words, the orientation angles may correspond to the reflection angles of the reflective surface 724.

For instance, after the first light L1 is generated from the light source 710, the first light L1 is output from the first light exit surface 725a. In this case, the first light L1 is reflected from the reflective surface 724, and refracted on the first light exit surface 725a. In this case, the first light L1 is output according to the first orientation angle from the first light exit surface 725a. In this case, the first orientation angle may be greater than or equal to 0°, and less than 180°.

For instance, after the second light L2 is generated from the light source 710, the second light L2 is output from the second light exit surface 725b. In this case, the second light L2 may be reflected from the reflective surface 724, and refracted on the second light exit surface 725b. In this case, the second light L2 is output according to the second orientation angle from the second light exit surface 725b. In this case, the second orientation angle may be greater than or equal to 0°, and less than 180°.

Figure 10:
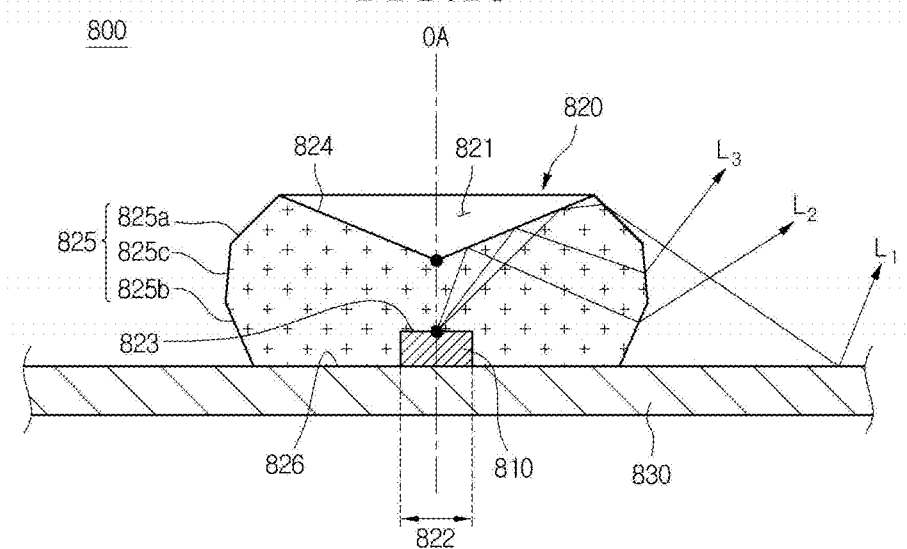
FIG. 10 is a sectional view showing a light emitting device according to the eighth embodiment.

FIG. 10 is a sectional view showing a light emitting device according to an eighth embodiment.

Referring to FIG. 10, a light emitting device 800 according to the present embodiment includes a light source 810, a luminous flux control member 820, and a driving substrate 830. The luminous flux control member 820 is formed therein a recess part 821 and a groove part 822. In addition, the luminous flux control member 820 includes an incident surface 823, a reflective surface 824, a light exit surface 825, and a rear surface 826. Hereinafter, since the above components of the light emitting device 800 according to the present embodiment are similar to the corresponding components of the previous embodiment described above, the details thereof will be omitted in order to avoid redundancy.

According to the luminous flux control member 820 of the present embodiment, the light exit surface 825 includes first and second light exit surfaces 825a and 823b and at least one third light exit surface 825c. The first light exit surface 825a is extended from the reflective surface 824. The second light exit surface 825b is extended from the incident surface 823. The third light exit surface 825c is extended between the first and second light exit surfaces 825a and 825b.

The third light exit surface 825c connects the first light exit surface 825a to the second light exit surface 825b. In this case, the third light exit surface 825c is bent or curved from the first light exit surface 825a. In addition, the third light exit surface 825c is bent or curved from the second light exit surface 825b. In addition, the third light exit surface 825c is inclined at a fifth slope from the optical axis OA. In this case, the third light exit surface 825c is parallel to the optical axis OA.

In this case, the third light exit surfaces 825c are sequentially connected to each other to connect the first light exit surface 825a to the second light exit surface 825b. In this case, the third light exit surfaces 825c may be inclined at different slopes from the optical axis OA.

In addition, the third light exit surface 825c outputs light according to a third orientation angle. In this case, the third light exit surface 825c may output the light in the lateral-upward direction or the lateral-downward direction. In this case, the third orientation angle may be greater than or equal to 0°, and less than 180°. Alternatively, the third orientation angle may be greater than or equal to 180°, and less than 360°. In addition, the third light exit surface 825c may refract the light.

For instance, after the third light L3 is generated from the light source 810, the third light L3 is output from the third light exit surface 825c. In this case, the third light L3 may be reflected from the reflective surface 824, and refracted on the third light exit surface 825c. In this case, the third light L3 is output according to a third orientation angle from the third light exit surface 825c. In this case, the third orientation angle may be greater than or equal to 0°, and less than 180°. Alternately, the third orientation angle may be greater than or equal to 180°, and less than 360°.

Figure 11:
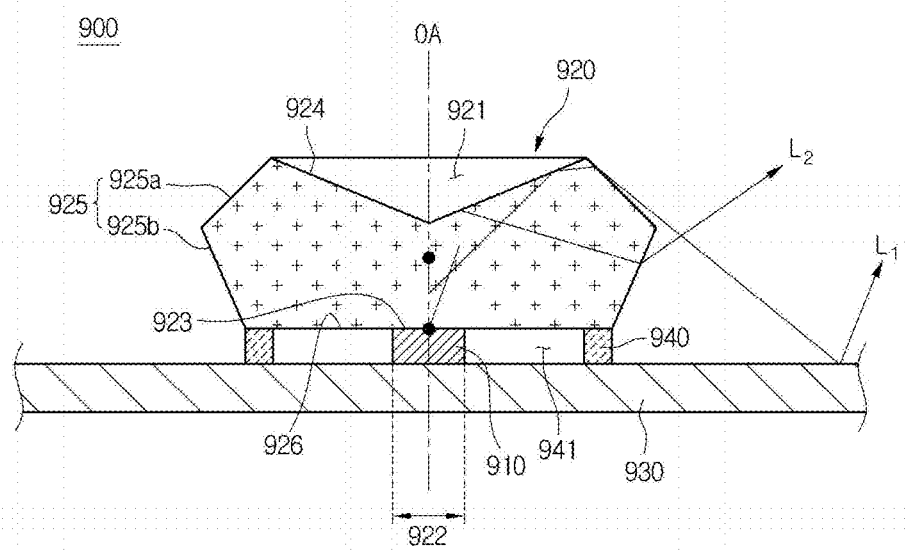
FIG. 11 is a sectional view showing a light emitting device according to the ninth embodiment.

FIG. 11 is a sectional view showing a light emitting device according to a ninth embodiment.

Referring to FIG. 11, a light emitting device 900 according to the present embodiment includes a light source 910, a luminous flux control member 920, and a driving substrate 930. The luminous flux control member 920 is formed therein a recess part 921. In addition, the luminous flux control member 920 includes an incident surface 923, a reflective surface 924, a light exit surface 925, and a rear surface 926. Hereinafter, since the above components of the light emitting device 900 according to the present embodiment are similar to the corresponding components of the previous embodiment described above, the details thereof will be omitted in order to avoid redundancy.

According to the light emitting device 900 of the present embodiment, the luminous flux control member 920 does not receive a light source 910. In this case, the rear surface 926 is spaced apart from the driving substrate 930. In addition, the incident surface 923 is provided on a plane the same as that of the rear surface 926. In other words, the height of the incident surface 923 from the driving substrate 930 may be the same as that of the rear surface 926 from the driving substrate 930. In addition, the incident surface 923 may closely make contact with the light source 910. Further, the incident surface 923 may be spaced apart from the light source 910.

In addition, the light emitting device 900 according to the present embodiment further includes a support member 940.

The support member 940 spaces the luminous flux control member 920 from the driving substrate 930. The support member 940 is mounted on the driving substrate 930. In this case, the support member 940 is provided at the central portion thereof with a receiving hole 941. In addition, the support member 940 receives the light source 910 through the receiving hole 941. Further, the support member 940 is coupled with an edge portion of the luminous flux control member 920. Accordingly, the luminous flux control member 920 is spaced apart from the driving substrate 930 by the height corresponding to the thickness of the support member 940.

Figure 12:
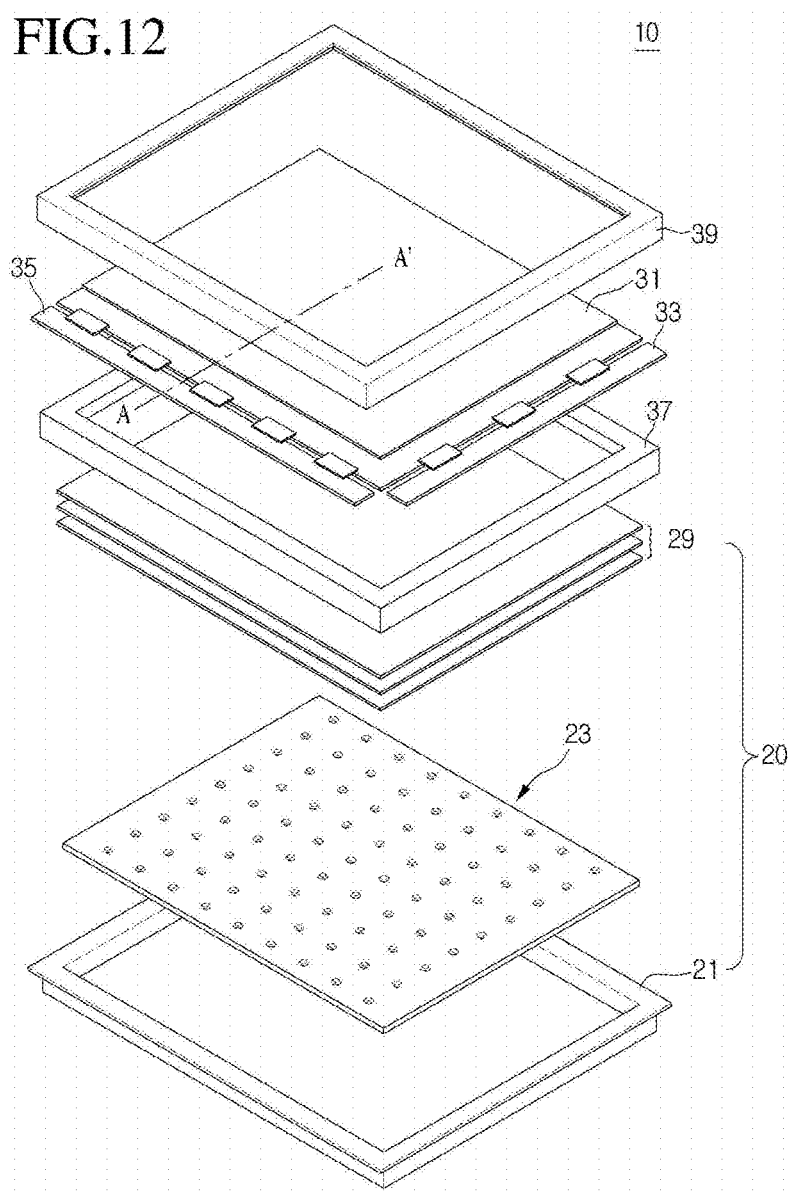
FIG. 12 is an exploded perspective view showing a display device according to the first to ninth embodiments.

FIG. 12 is an exploded perspective view showing a display device according to the first to ninth embodiments. In addition, FIG. 13 is a sectional view taken along line A-A' of FIG. 12.

Figure 13:
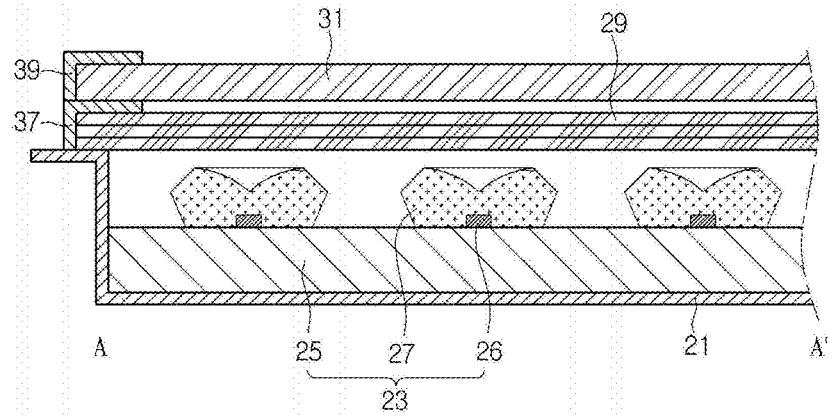
FIG. 13 is a sectional view taken along line A-A' of FIG. 12.

Referring to FIGS. 12 and 13, a display device 10 according to the present embodiment includes a backlight unit 20, a display panel 31, panel control substrates 33 and 35, a panel guide 37, and an upper case 39.

The backlight unit 20 generates and outputs light. In this case, the backlight unit 20 is realized as a direct-type backlight unit according to the embodiment. The backlight unit 20 includes a lower cover 21, a light emitting device 23, and at least one optical sheet 29.

The lower cover 21 is realized in the shape of a box having an open top surface. The lower cover 21 receives the light emitting device 20 through the upper portion thereof to support and protect the light emitting device 23. In addition, the lower cover 21 supports the optical sheet 29 and the display panel 31. In this case, the lower cover 21 may include metal. For example, the lower cover 21 may be formed by bending or curving a metallic plate. In this case, as the metallic plate is bent or curved, the insertion space of the light emitting device 23 may be formed in the lower cover 21.

The light emitting device 23 includes a driving substrate 25, a plurality of light sources 26, and a plurality of luminous flux control members 27.

The driving substrate 25 supports the light sources 26 and the luminous flux control members 27. In addition, the driving substrate 25 controls the driving of the light sources 26. In other words, the driving substrate 25 transmits driving signals to the light sources 26.

The light sources 25 are mounted on the driving substrate 25. In this case, on the driving substrate 25, the light sources 26 are distributed at a predetermined distance. For example, the light sources 26 may be arranged in a grid structure. In addition, the light sources 26 are electrically connected to the driving substrate 25.

Each of the luminous flux control members 27 individually covers each light source 26. In this case, the luminous flux control member 27 may have the above structure. The luminous flux control member 27 outputs the light generated from the light source 26 according to at least two orientation angles.

The optical sheet 29 improves the characteristic of light incident thereon from the light emitting device 23 to allow the light to pass therethrough. In this case, for example, the optical sheet 29 may include a polarize sheet, a prism sheet, or a diffusion sheet.

The display panel 31 displays images by using the light input from the backlight unit 20. The display panel 31 is mounted on the backlight unit 20 through the bottom surface thereof.

Although not shown, the display panel 31 includes a thin film transistor (TFT) substrate and a color filter (C/F) substrate, which are opposite to each other and bonded to each other in such a manner that cell gaps are uniformly maintained, and a liquid crystal layer interposed between the TFT substrate and the C/F substrate. The TFT substrate changes the alignment of liquid crystal on the liquid crystal layer. Accordingly, the TFT substrate changes the transmittance of the light passing through the optical sheet. The TFT substrate has a structure in which a plurality of gate lines are formed, and a plurality of data lines crossing the gate lines are formed, and thin film transistors are formed at the interconnection regions between the gate lines and the data lines. The color filter substrate allows light passing through the liquid crystal layer to be expressed as light having a predetermined color.

The panel control substrates 33 and 35 are provided to control the display panel 31. The panel control substrates 33 and 35 include a gate driving substrate 33 and a data driving substrate 35. In this case, the panel control substrates 33 and 35 are electrically connected to the display panel 31 through a chip on film (COF). In this case, the COF may be replaced with a tape carrier package (TCP).

The panel guide 37 supports the display panel 31. The panel guide 37 is interposed between the backlight unit 20 and the display panel 31.

The upper case 39 surrounds the edge portions of the display panel 31. In addition, the upper case 39 may be coupled with the panel guide 37.

According to the present embodiment, the luminous flux control member 27 outputs light according to at least two orientation angles, so that light generated from the light source 26 can be diffused in a wider range. Accordingly, the light emitting device 23 can effectively irradiate light toward the display panel 31. Therefore, even if the number of the light sources 26 is not increased in the backlight unit 20, the performance of the display device 10 can be ensured. In addition, the distance between the backlight unit 20 and the display panel 31 can be reduced. In other words, the thickness of the display device 10 can be reduced. Therefore, the uniformity in the brightness of the display device 10 can be ensured, and the display device 10 can be realized in small size.

Figure 14:
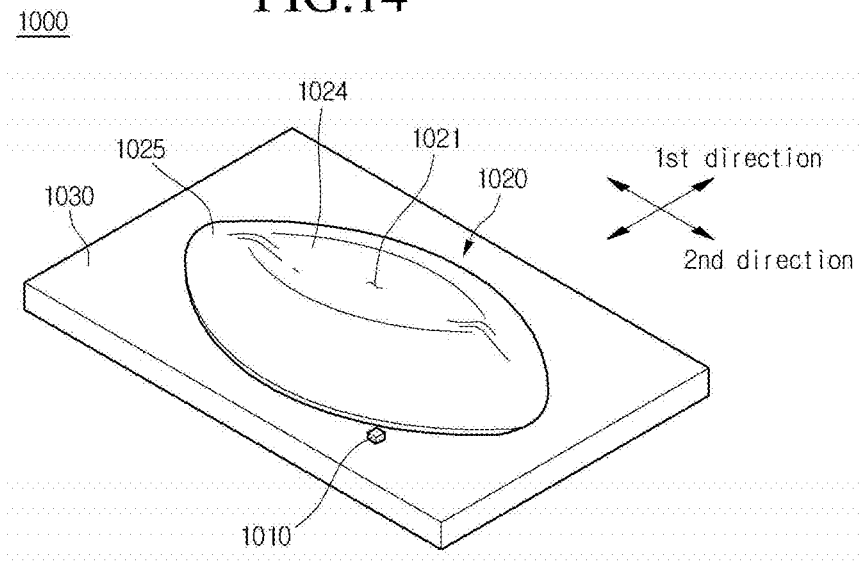
FIG. 14 is an exploded perspective view showing a light emitting device according to the tenth embodiment.
Figure 15:
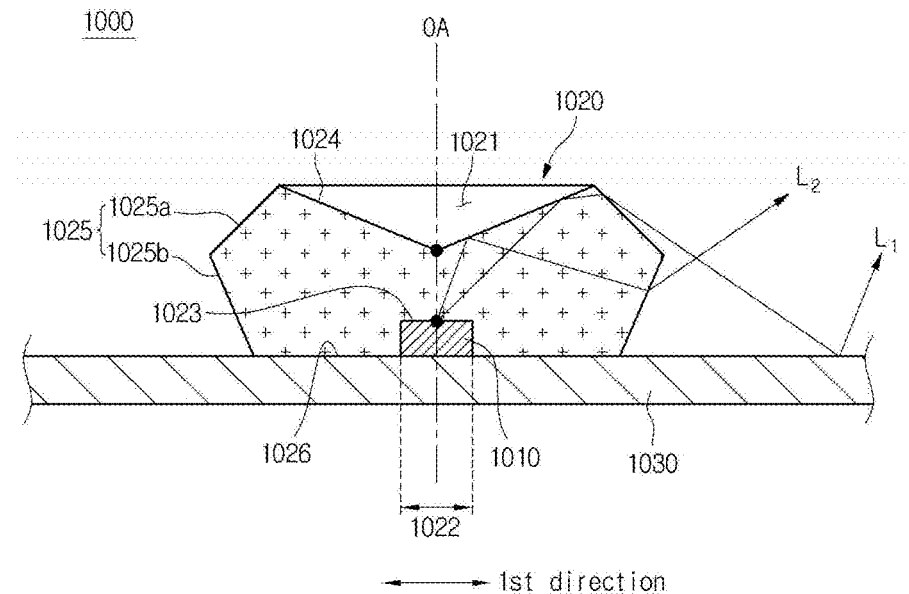
FIG. 15 is a sectional view taken along the first direction of FIG. 14.
Figure 16:
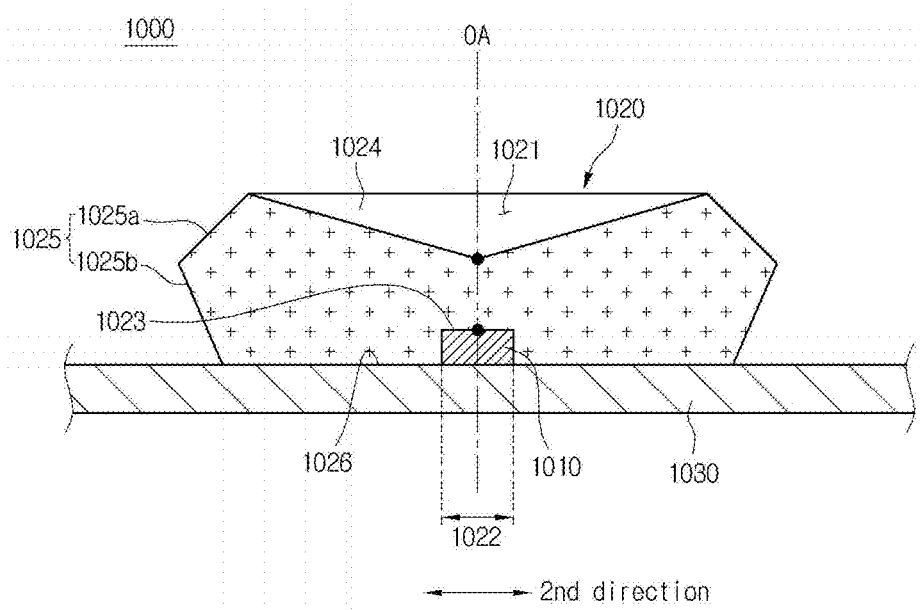
FIG. 16 is a sectional view taken along the second direction of FIG. 14.

FIG. 14 is an exploded perspective view showing a light emitting device according to a tenth embodiment. FIG. 15 is a sectional view taken along a first direction of FIG. 14. FIG. 16 is a sectional view taken along a second direction of FIG. 14.

Referring to FIGS. 14, 15, and 16, a light emitting device 1000 according to the present embodiment includes a light source 1010, a luminous flux control member 1020, and a driving substrate 1030. The luminous flux control member 1020 is formed therein a recess part 1021 and a groove part 1022. In addition, the luminous flux control member 1020 includes an incident surface 1023, a reflective surface 1024, a light exit surface 1025, and a rear surface 1026. Hereinafter, since the above components of the light emitting device 1000 according to the present embodiment are similar to the corresponding components of the previous embodiment described above, the details thereof will be omitted in order to avoid redundancy.

The luminous flux control member 1020 according to the embodiment has an anisotropic structure. In other words, the luminous flux control member 1020 has a plane symmetric structure instead of a line symmetric structure. In this case, the luminous flux control member 1020 has a shorter length in the first direction, and has a longer length in the second direction. In this case, the first and second directions are perpendicular to the optical axis OA of the light source 1010.

In addition, the first and second directions are perpendicular to each other. In other words, when viewed from the plan view, the luminous flux control member 1020 may have the shape of an oval. Further, the recess part 1021 may have the shape of an oval when viewed from the plan view.

In this case, the first and second symmetric surfaces are defined. The first symmetric surface is a plane to be extended in the first direction from the optical axis OA of the light source 1010. The second symmetric surface is a plane to be extended in the second direction from the optical axis OA of the light source 1010. In other words, the optical axis OA of the light source 1010 is provided on the first and second symmetric surfaces. The first symmetric surface crosses the second symmetric surface on the optical axis OA of the light source 1010. In this case, the area of the second symmetric surface exceeds the area of the first symmetric surface.

In addition, the luminous flux control member 1020 has a plane symmetric structure about each of the first and second symmetric surfaces. In other words, the luminous flux control member 1020 may be divided into two equal parts by the first symmetric surface. In addition, the luminous flux control member 1020 may be divided into two equal parts by the second symmetric surface.

According to the present embodiment, the light source 1010 generates light. Thereafter, the luminous flux control member 1020 outputs the light at mutually different orientation angles according to directions. In this case, the orientation angle of the light output from the luminous flux control member 1020 may be gradually reduced as the light travels in the second direction from the first direction.

In addition, the luminous flux control member 1020 outputs light according to at least two orientation angles on the basis of the first direction. In this case, the luminous flux control member 1020 outputs light in one of the lateral-upward direction and lateral-downward direction on the basis of the first direction. In other words, the luminous flux control member 1020 may output light in the lateral-upward direction according to the orientation angles. In addition, the luminous flux control member 1020 may output the light in the lateral-downward direction according to the orientation angles. In detail, the luminous flux control member 1020 may output light in the lateral-upward direction according to one of the orientation angles, and output light in the lateral-downward direction according to another of the orientation angles. Thereafter, the driving substrate 1030 may reflect light.

For instance, after the first light L1 is generated from the light source 1010, the first light L1 is output from the first light exit surface 1025a. In this case, the first light L1 is reflected from the reflective surface 1024, and refracted on the first light exit surface 1025a. In this case, the first light L1 is output according to the first orientation angle from the first light exit surface 1025a. In this case, the first orientation angle may be greater than or equal to 180°, and less than 360°. In addition, the first light L1 is reflected from the driving substrate 1030.

Meanwhile, after a second light L2 is generated from the light source 1010, the second light L2 is output from the second light exit surface 1025b. In this case, the second light L2 may be reflected from the first reflective surface 1024a, and refracted on the second light exit surface 1025b. In this case, the second light L2 is output according to the second orientation angle from the second light exit surface 1025b. In this case, the second orientation angle may be greater than or equal to 0°, and less than 180°. In addition, the second orientation angle may be greater than or equal to 180°, and less than 360°. In addition, the second light L2 may be reflected from the driving substrate 1030.

Figure 17:
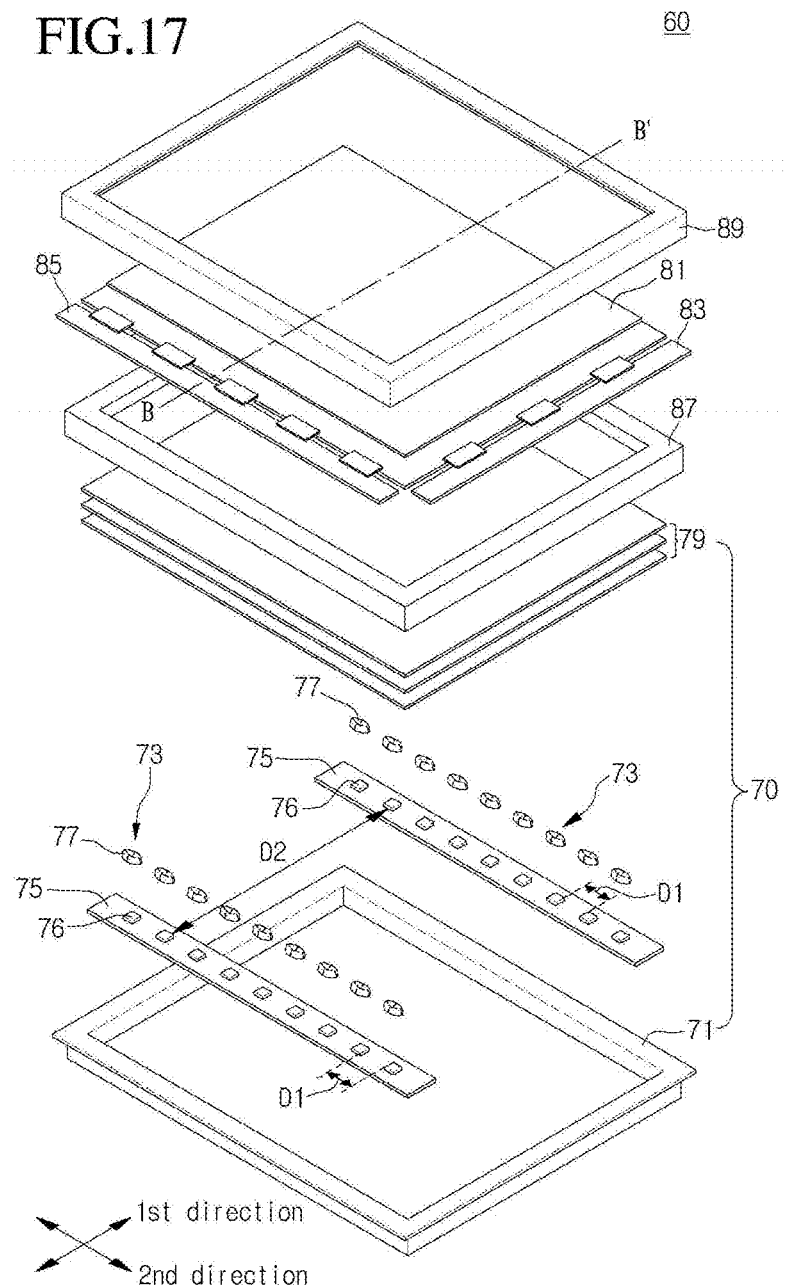
FIG. 17 is an exploded perspective view showing a display device according to the tenth embodiment.

FIG. 17 is an exploded perspective view showing a display device according to the tenth embodiment. In addition, FIG. 18 is a sectional view taken along line B-B' of FIG. 17.

Figure 18:
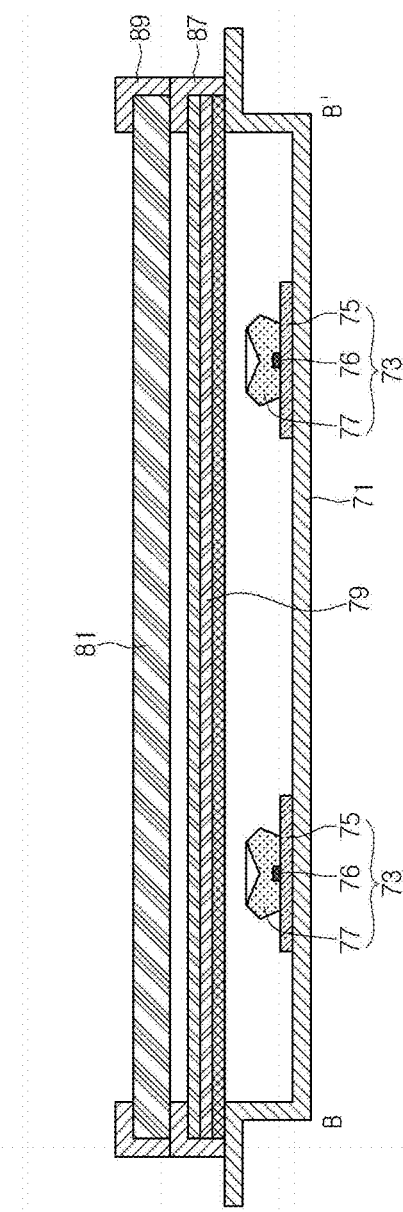
FIG. 18 is a sectional view taken along line B-B' of FIG. 17.

Referring to FIGS. 17 and 18, a display device 60 according to the present embodiment includes a backlight unit 70, a display panel 81, panel control substrates 83 and 85, a panel guide 87, and an upper case 89. In addition, the backlight unit 70 includes a lower cover 71, a light emitting device 73, and at least one optical sheet 79. Hereinafter, since components of the display device 60 according to the present embodiment are similar to those of the previous embodiment described above, the details thereof will be omitted in order to avoid redundancy.

According to the display device 60 of the present embodiment, the light emitting device 73 includes a plurality of driving substrates 75, a plurality of light sources 76, and a plurality of luminous flux control members 77.

The driving substrates 75 are spaced apart from each other in the first direction while being extended in parallel to each other. In this case, the driving substrates 75 are extended in the second direction. In this case, the driving substrates 75 may have the shape of a bar longitudinally formed in the second direction. In addition, the number of the driving substrates 75 may be determined depending on the area of the display panel 81. In this case, the area of the display panel 81 is determined by a width corresponding to the first direction and a length corresponding to the second direction. The width corresponding to the first direction of each driving substrate 75 may be determined depending on the width of the display panel 81. In this case, the width of each driving substrate 75 may be in the range of about 5 mm to about 3 cm. In addition, the length corresponding to the second direction of each driving substrate 75 may be determined depending on the length of the display panel 81.

The driving substrates 75 support the light sources 76 and the luminous flux control members 77. In addition, the driving substrates 75 control the driving of the light sources 75. In other words, the driving substrate 75 transmits driving signals to the light sources 76.

The light sources 76 are mounted on the driving substrates 75. In this case, the light sources 76 are provided in the second direction on the driving substrate 75 while forming a line. In other words, the light sources 76 are mounted on the driving substrate 75 in a line with each other. The light sources 76 are spaced apart from each other on the related driving substrate 75 by a predetermined distance. In this case, a first distance D1 between the light sources 76 mounted on the same driving substrate 75 is smaller than a second distance D2 between the light sources 76 mounted on two adjacent driving substrates 75. For example, the second distance D2 may be about 1.3 times to about 10 times greater than the first distance D1.

The light sources 76 are electrically connected to the driving substrates 75. In addition, the light sources 76 are driven under the control of the driving substrates 75 to generate light.

Each of the luminous flux control members 77 individually covers each light source 26. In this case, the luminous flux control members 77 may have the structure described above according to the embodiment. In other words, the luminous flux control members 77 diffuse light generated from the light sources 76. In this case, the luminous flux control members 77 less diffuse light in the second direction as compared with the case that the luminous flux control members 77 diffuse light in the first direction. In this case, the luminous flux control members 77 may refract light.

In addition, according to the display device 60 of the present embodiment, the lower cover 71 reflects light output from the luminous flux control member 77. In this case, the lower cover 71 reflects light output in the lateral-downward direction on the basis of the first direction from the luminous flux control member 77. In this case, the lower cover 71 may reflect the light according to at least one of orientation angles. In addition, the lower cover 71 may totally reflect the light. Besides, the lower cover 71 may reflect the light in the lateral-upward direction. To this end, the lower cover 71 may be formed by coating a reflective material on a metallic plate. Alternately, the lower cover 71 may be formed by mounting a reflective structure on the metallic plate.

According to the present embodiment, the luminous flux control member 77 outputs light according to at least two orientation angles on the basis of the first direction, so that the light generated from the light source 76 may be diffused in the wider range. Accordingly, the light emitting device 73 can effectively irradiate light toward the display panel 81. Therefore, even if the number of the light sources 76 is not increased in the backlight unit 20, the performance of the display device 60 can be ensured. In addition, the distance between the backlight unit 70 and the display panel 81 can be reduced. In other words, the thickness of the display device 60 can be reduced. Therefore, the uniformity in the brightness of the display device 60 can be ensured, and the display device 60 can be realized in small size.

Meanwhile, the embodiments of the disclosure disclosed in the subject specification and the accompanying drawings are just exemplary and do not limit the present disclosure. In other words, those skilled in the art to which the present invention pertains will know that various modifications and applications which have not been exemplified may be carried out within a range which does not deviate from the essential characteristics of the embodiments.

What is claimed is:

1. A luminous flux control member comprising:
   an incident surface onto which a light is incident;
   a reflective surface reflecting the incident light; and
   a light exit surface outputting the reflected light according to at least two orientation angles with respect to one direction perpendicular to a central axis connecting a center of the incident surface with a center of the reflective surface,
   wherein the reflective surface reflects the incident light in both an upwardly inclined direction and a downwardly inclined direction,
   wherein the light exit surface refracts the reflected light in both an upwardly inclined direction and a downwardly inclined direction; and
   wherein the light exit surface comprises a first subsurface, a second subsurface, and a third subsurface, wherein each subsurface has a planar surface, wherein a first obtuse angle is formed between the first subsurface and the second subsurface, and wherein a second obtuse angle is formed between the second subsurface and the third subsurface.

2. The luminous flux control member of claim 1, wherein the light exit surface refracts the reflected light according to the orientation angles.

3. The luminous flux control member of claim 1, wherein the light exit surface comprises:
   a first light exit surface extended from the reflective surface and refracting the reflected light according to one angle of the orientation angles; and
   a second light exit surface bent from the first light exit surface and refracting the reflected light according to another angle of the orientation angles.

4. The luminous flux control member of claim 1, wherein the reflective surface reflects the incident light according to at least two reflection angles.

5. The luminous flux control member of claim 4, wherein the reflective surface comprises:
   a first reflective surface extended from the central axis and reflecting the incident light according to one of the reflection angles; and
   a second reflective surface extended from the light exit surface and reflecting the incident light according to another of the reflection angles.

6. The luminous flux control member of claim 1, wherein at least one of the light exit surface and the reflective surface is a single spherical surface.

7. The luminous flux control member of claim 1, wherein one of the orientation angles is greater than or equal to 0° and less than 180°, and another of the orientation angles is greater than or equal to 180° and less than 360°.

8. The luminous flux control member of claim 1, wherein all of the orientation angles are greater than or equal to 0° and less than 180°, or greater than or equal to 180° and less than 360°.

9. A light emitting device comprising:
   a driving substrate;
   a light source connected to the driving substrate; and
   a luminous flux control member onto which a light generated from the light source is incident,
   wherein the luminous flux control member comprises:
   an incident surface onto which the generated light is incident;
   a reflective surface reflecting the incident light; and
   a light exit surface outputting the reflected light according to at least two orientation angles with respect to one direction perpendicular to a central axis connecting a center of the incident surface with a center of the reflective surface,
   wherein the reflective surface reflects the incident light in both an upwardly inclined direction and a downwardly inclined direction,
   wherein the light exit surface refracts the reflected light in both an upwardly inclined direction and a downwardly inclined direction; and
   wherein the light exit surface comprises a first subsurface, a second subsurface, and a third subsurface, wherein each subsurface has a planar surface, wherein a first obtuse angle is formed between the first subsurface and the second subsurface, and wherein a second obtuse angle is formed between the second subsurface and the third subsurface.

10. The light emitting device of claim 9, wherein the driving substrate reflects the output light.

11. The light emitting device of claim 9, wherein the light exit surface refracts the reflected light according to the orientation angles.

12. The light emitting device of claim 9, wherein the reflective surface reflects the incident light according to at least two reflection angles.

13. A display device comprising:
   a driving substrate;
   a light source connected to the driving substrate;
   a luminous flux control member onto which a light generated from the light source is incident; and
   a display panel onto which a light output from the luminous flux control member is incident, wherein the luminous flux control member comprises:
an incident surface onto which the generated light is incident;
a reflective surface reflecting the incident light; and
a light exit surface outputting the reflected light according to at least two orientation angles with respect to one direction perpendicular to a central axis connecting a center of the incident surface with a center of the reflective surface,
wherein the reflective surface reflects the incident light in both an upwardly inclined direction and a downwardly inclined direction,
wherein the light exit surface refracts the reflected light in both an upwardly inclined direction and a downwardly inclined direction; and
wherein the light exit surface comprises a first subsurface, a second subsurface, and a third subsurface, wherein each subsurface has a planar surface, wherein a first obtuse angle is formed between the first subsurface and the second subsurface, and wherein a second obtuse angle is formed between the second subsurface and the third subsurface.

14. The display device of claim 13, wherein the driving substrate reflects the output light toward the display panel.

15. The display device of claim 13, further comprising a cover receiving the driving substrate and reflecting the output light toward the display panel.

16. The display device of claim 13, wherein the light exit surface refracts the reflected light according to the orientation angles.

17. The display device of claim 13, wherein the reflective surface reflects the incident light according to at least two reflection angles.

* * * * *